(12) United States Patent  (10) Patent No.: US 11,925,126 B2
Schuster et al.  (45) Date of Patent: Mar. 5, 2024

(54) TECHNOLOGIES FOR TUNING SUPERCONDUCTING JOSEPHSON JUNCTIONS

(71) Applicant: THE UNIVERSITY OF CHICAGO, Chicago, IL (US)

(72) Inventors: David Schuster, Chicago, IL (US); Andrew Oriani, Chicago, IL (US); Larry Chen, Chicago, IL (US)

(73) Assignee: THE UNIVERSITY OF CHICAGO, Chicago, IL (US)

(*) Notice: Subject to any disclaimer, the term of this patent is extended or adjusted under 35 U.S.C. 154(b) by 368 days.

(21) Appl. No.: 17/434,184

(22) PCT Filed: Mar. 2, 2020

(86) PCT No.: PCT/US2020/020594
§ 371 (c)(1),
(2) Date: Aug. 26, 2021

(87) PCT Pub. No.: WO2020/180762
PCT Pub. Date: Sep. 10, 2020

(65) Prior Publication Data
US 2022/0140221 A1    May 5, 2022

Related U.S. Application Data

(60) Provisional application No. 62/813,068, filed on Mar. 3, 2019.

(51) Int. Cl.
*H10N 60/12* (2023.01)
*G01K 7/01* (2006.01)
*H10N 60/01* (2023.01)

(52) U.S. Cl.
CPC ............ *H10N 60/12* (2023.02); *G01K 7/01* (2013.01); *H10N 60/0912* (2023.02)

(58) Field of Classification Search
None
See application file for complete search history.

(56) References Cited

U.S. PATENT DOCUMENTS

| 5,155,434 | A | 10/1992 | Fujimaki |
| 9,490,255 | B1 * | 11/2016 | Edge ............... H01L 21/823842 |
| 2009/0057652 | A1 | 3/2009 | Nevirkovets et al. |
| 2013/0119351 | A1 | 5/2013 | Shea et al. |

(Continued)

FOREIGN PATENT DOCUMENTS

| CN | 106486543 A | * | 3/2017 | ............ H01L 29/402 |
| JP | 2003258130 A | * | 9/2003 | |

OTHER PUBLICATIONS

PCT Search Report prepared for PCT/US2020/020594, completed May 10, 2020.

*Primary Examiner* — Michael Lebentritt
(74) *Attorney, Agent, or Firm* — Barnes & Thornburg LLP

(57) ABSTRACT

Technologies for tuning a resistance of tunnel junctions such as Josephson junctions are disclosed. In the illustrative embodiment, a Josephson junction is heated to 85 Celsius, and an electric field is applied to the Josephson junction. The heat and the electric field cause the resistance of the Josephson junction to increase. Monitoring the Josephson junction during the application of the electric field allows for the resistance of the Josephson junction to be adjusted to a particular value.

17 Claims, 5 Drawing Sheets

(56) References Cited

U.S. PATENT DOCUMENTS

| | | | |
|---|---|---|---|
| 2014/0001570 A1* | 1/2014 | Brodsky | H01L 29/517 257/E27.06 |
| 2014/0315723 A1 | 10/2014 | Moyerman et al. | |
| 2017/0141285 A1 | 5/2017 | Krogstrup et al. | |

* cited by examiner

TECHNOLOGIES FOR TUNING SUPERCONDUCTING JOSEPHSON JUNCTIONS

CROSS-REFERENCE TO RELATED APPLICATIONS

The present application is a national stage entry under 35 U.S.C. § 371(b) of PCT International Application No. PCT/US2020/020594, filed Mar. 2, 2020, which claims the benefit of U.S. Provisional Application No. 62/813,068, entitled "Tuning Josephson Junctions" and filed on Mar. 3, 2019, the entirety of both of which is are hereby incorporated by reference.

BACKGROUND

Josephson junctions are used for a variety of applications, such as super conducting quantum interference devices (SQUIDs) and as part of qubits in superconducting quantum information processing. The insulating layer is important in dictating how the Josephson junction will behave. The junction area, the insulator composition, and the insulator thickness all affect the potential barrier and the electron tunneling energy. The small nature of the junction features makes precise manufacturing of a Josephson junction with a particular tunneling energy difficult.

SUMMARY

According to one aspect of the disclosure, a method for tuning a resistance of a metal-metal oxide-metal junction comprises heating the metal-metal oxide-metal junction to a temperature of at least 60° Celsius; applying an electric field across the heated metal-metal oxide-metal junction, wherein applying the electric field across the heated metal-metal oxide-metal junction causes the resistance of the metal-metal oxide-metal junction to increase by at least 1%.

In some embodiments, heating the metal-metal oxide-metal junction to a temperature of at least 60° Celsius comprises heating the metal-metal oxide-metal junction to a temperature of at least 75° Celsius, wherein applying the electric field across the heated metal-metal oxide-metal junction comprises to apply a voltage of at least 0.3 volts across the heated metal-metal oxide-metal junction for a cumulative total of at least one hour to cause the resistance of the metal-metal oxide-metal junction to increase by at least 3%.

In some embodiments, the metal-metal oxide-metal junction is a superconductor-insulator-superconductor junction.

In some embodiments, the method may further include cooling the superconductor-insulator-superconductor junction below a superconducting critical temperature of the superconductor-insulator-superconductor junction; and using the superconductor-insulator-superconductor junction in a quantum information circuit below the superconducting critical temperature and after causing the resistance to increase.

In some embodiments, the method may further include cooling the superconductor-insulator-superconductor junction below a superconducting critical temperature of the superconductor-insulator-superconductor junction; and using the superconductor-insulator-superconductor junction in a superconducting quantum interference device (SQUID) below the superconducting critical temperature and after causing the resistance to increase.

In some embodiments, heating the metal-metal oxide-metal junction comprises at least one of (i) applying heat via direct conduction, (ii) applying heat via indirect convection, and (iii) applying heat via a coherent or incoherent radiation source.

In some embodiments, applying an electric field across the heated metal-metal oxide-metal junction comprises at least one of (i) applying electric field by passing a current through the heated metal-metal oxide-metal junction and (ii) applying an external electric field to the heated metal-metal oxide-metal junction.

In some embodiments, the method may further include measuring a change in resistance of the metal-metal oxide-metal junction caused by application of the electric field to the heated metal-metal oxide-metal junction; controlling the applied electric field and the applied heat based on the measured change in resistance of the metal-metal oxide-metal junction.

In some embodiments, controlling the applied electric field and the applied heat based on the measured change in resistance of the metal-metal oxide-metal junction comprises determining that the resistance of the metal-metal oxide-metal junction is above a predetermined threshold; and removing the electric field in response to a determination that the resistance of the metal-metal oxide-metal junction is above the predetermined threshold.

In some embodiments, controlling the applied electric field and the applied heat based on the measured change in resistance of the metal-metal oxide-metal junction comprises automatically controlling the applied electric field and the applied heat using a compute device.

In some embodiments, the method may further include modulating, by the compute device, the heat and electric field applied to the metal-metal oxide-metal junction.

According to one aspect of the disclosure, a method for tuning a resistance of a tunnel junction comprises heating the tunnel junction to a temperature of at least 60° Celsius; applying an electric field across the heated tunnel junction; measuring a change in resistance of the tunnel junction caused by application of the electric field to the heated tunnel junction; and controlling at least one of the electric field applied across the heated tunnel junction or the temperature of the tunnel junction based on the measured change in resistance of the tunnel junction.

In some embodiments, heating the tunnel junction to a temperature of at least 60° Celsius comprises heating the tunnel junction to a temperature of at least 75° Celsius, wherein applying the electric field across the heated tunnel junction comprises to apply a voltage of at least 0.3 volts across the heated tunnel junction for a cumulative total of at least one hour to cause the resistance of the tunnel junction to increase by at least 3%.

In some embodiments, the tunnel junction is a superconductor-insulator-superconductor junction, the method further comprising cooling the superconductor-insulator-superconductor junction below a superconducting critical temperature of the superconductor-insulator-superconductor junction; and using the superconductor-insulator-superconductor junction in a quantum information circuit below the superconducting critical temperature and after causing the resistance to increase.

In some embodiments, controlling at least one of the electric field applied across the heated tunnel junction or the temperature of the tunnel junction based on the measured change in resistance of the tunnel junction comprises controlling at least one of the electric field applied across the heated tunnel junction or the temperature of the tunnel junction in order to match the resistance of the tunnel junction to a resistance of a second tunnel junction different from the first.

In some embodiments, the method may further include cooling the tunnel junction to room temperature after applying the electric field; and repeating the steps of heating the tunnel junction to the temperature of at least 60° Celsius and applying the electric field across the heated tunnel junction.

In some embodiments, controlling the applied electric field and the applied heat based on the measured change in resistance of the tunnel junction comprises determining that the resistance of the tunnel junction is above a predetermined threshold; and removing the electric field in response to a determination that the resistance of the tunnel junction is above the predetermined threshold.

According to one aspect of the disclosure, a compute device for tuning a resistance of a metal-metal oxide-metal junction comprises heat controller circuitry configured to output a signal to a heat source to heat the metal-metal oxide-metal junction to a temperature of at least 60° Celsius; electric field controller circuitry configured to output a signal to an electric field generator to apply an electric field across the heated metal-metal oxide-metal junction; and resistance monitor circuitry configured to monitor a change in resistance of the metal-metal oxide-metal junction caused by application of the electric field.

In some embodiments, the electric field controller circuitry is configured to determine whether the resistance of the metal-metal oxide-metal junction is above a predetermined threshold; and remove the electric field in response to a determination that the resistance of the metal-metal oxide-metal junction is above the predetermined threshold.

In some embodiments, the compute device is integrated into a system that further comprises the heat source and the electric field generator.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
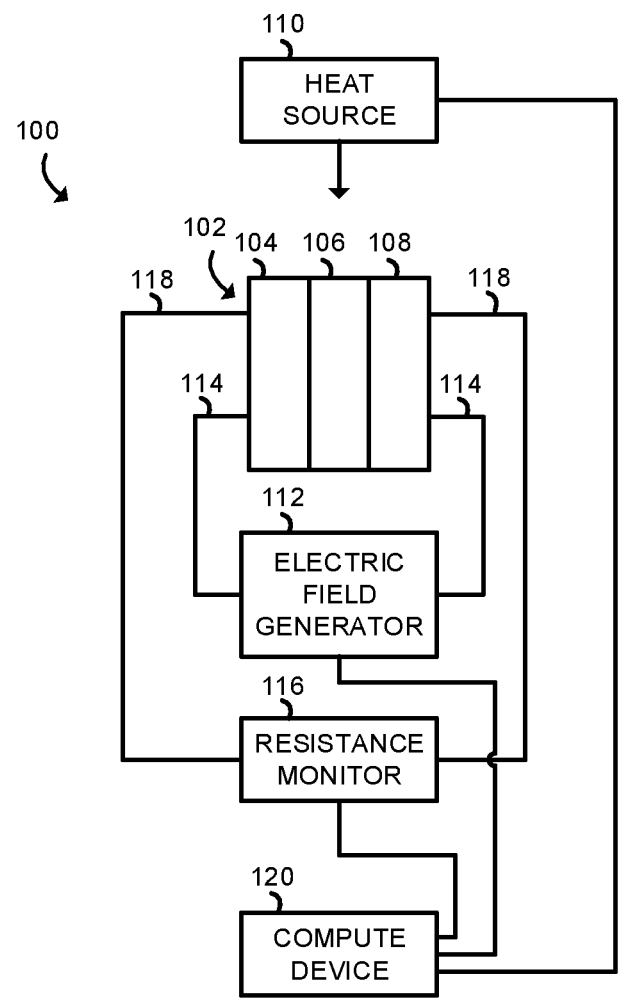
FIG. 1 is a simplified block diagram of one embodiment of a system for tuning the resistance of a Josephson junction.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative system 100 for tuning a resistance of a tunnel junction 102 (such as a metal-metal oxide-metal junction 102 or a Josephson junction 102) includes the tunnel junction 102 that has a first layer 104, a second layer 106, and a third layer 108. In the illustrative embodiment, the layers are a first metal layer 104, a metal oxide layer 106, and a second metal layer 108. The system 100 further includes a heat source 110, an electric field generator 112 connected to the tunnel junction 102 by one or more wires 114, a resistance monitor 116 connected to the tunnel junction 102 by one or more wires 118, and a compute device 120 that may be connected to the resistance monitor 116, the electric field generator 112, and the heat source 110.

In use, in the illustrative embodiment, the heat source 110 heats up a Josephson junction 102, such as to 85° Celsius. The electric field generator 112 applies an electric field across the Josephson junction 102, such as by passing a current through the Josephson junction 102. The resistance monitor 116 monitors the resistance across the Josephson junction, such as by measuring a voltage caused by the current passing through the Josephson junction. The application of the electric field causes metal ions to migrate from the metal oxide layer 106 to one of the metal layers 104, 108, increasing the resistance of the Josephson junction 102. The resistance may be monitored by the compute device 120 or by an operator of the system 100. When the resistance reaches a desired level, the electric field generator 112 may remove the electric field, and the Josephson junction 102 may be cooled to room temperature.

In some embodiments, the Josephson junction 102 may be integrated into another system, such as a superconducting quantum interference device (SQUID) or a quantum information processing system such as a quantum circuit, a quantum computer, a quantum repeater, a part of a quantum cryptography system, etc. The Josephson junction 102 may be integrated into such a system before or after the resistance of the Josephson junction 102 is tuned. In some embodiments, multiple Josephson junctions 102 may be integrated into a single system. In such embodiments, the Josephson junctions 102 may be integrated into a single chip, circuit, or other component. The Josephson junctions 102 may be tuned individually or tuned with other Josephson junctions 102. For example, several Josephson junctions 102 on a single chip may be heated to the same temperature and then have their respective resistances tuned by application of different electric fields to the different Josephson junctions 102. Additionally or alternatively, different Josephson junctions 102 may be heated to different temperatures and have the same and/or different electric fields applied to them. In that way, several Josephson junctions 102 that have a different initial resistance can be tuned to having approximately the same resistance (such as less than a 1% difference). It should be appreciated that the resistance is proportional to the Josephson energy when the junction is cooled below a critical superconducting temperature, so several Josephson junctions with the same resistance will also have the same Josephson energy.

In the illustrative embodiment, the tunnel junction is a metal-metal oxide-metal Josephson junction. The first metal layer 104 is aluminum, the metal oxide layer 106 is aluminum oxide, and the second metal layer 108 is aluminum, giving a superconducting-insulator-superconducting (SIS) junction when cooled below the superconducting transition temperature of approximately 1.75 Kelvin. Additionally or alternatively, in other embodiments, different metals and metal oxides may be used. For example, one or both metal layers 104, 108 may be niobium, tantalum, or any other suitable metal. The metal oxide layer 106 may be any suitable native or non-native metal oxide, such as tantalum oxide or niobium oxide. In some embodiments, the tunnel junction 102 may not be a Josephson junction. For example, the second layer 106 may be a non-metal oxide insulator or a non-superconducting metal. In some embodiments, one or both of the first layer 104 and the third layer 108 may be non-superconducting, leading to a superconducting-insulator-normal conducting (SIN) junction or a normal conducting-insulator-normal conducting (NIN) junction. Although illustrative embodiments described herein may be described as having a Josephson junctions 102, it should be appreciated that the present disclosure envisions replacing the Josephson junctions 102 with other types of tunnel junctions 102 (such as metal-oxide-semiconducting junctions) in at least some embodiments.

The heat source 110 may be any suitable heat source. In the illustrative embodiment, the heat source 110 is a hot-plate. Additionally or alternatively, in some embodiments, the heat source 110 may be embodied as any suitable conductive, radiative, or convective heat source, such as a hot air source, an oven, coherent or incoherent light source such as an LED, laser, light bulb, etc. In some embodiments, such as where the heat source 110 is embodied as a laser, the Josephson junction 102 may be heated to a different temperature from other nearby components, including other Josephson junctions 102. The heat source 110 may apply a specific amount of power to the system (such as setting a power usage of a hot plate or laser to a specific value) or the heat source 110 may have a particular temperature set point, monitoring a temperature of the Josephson junction 102 or other component of the system 100 as feedback The heat source 110 may heat the Josephson junction 102 up to any suitable temperature below a failure temperature of the Josephson junction 102. In the illustrative embodiment, the Josephson junction 102 is heated to 85° Celsius. Additionally or alternatively, the Josephson junction 102 may be heated to any suitable temperature, such as any temperature from 50-150° Celsius.

The electric field generator 112 may be any suitable electric field generator. In the illustrative embodiment, the electric field generator 112 is a current source in a constant voltage mode that generates an electric field due to the resistance of the Josephson junction 102. The electric field generator 112 may apply any suitable current, such as 1-100 microamps. In some embodiments, the current may be selected based on an initial resistance level to cause a certain voltage to be applied to the Josephson junction 102. For example, in one embodiment, the initial resistance of the Josephson junction 102 may be measured to be 10 kΩ, and a desired initial voltage level across the Josephson junction 102 may be 0.5 volts, corresponding to a current of 50 microamps.

Additionally or alternatively, any other suitable direct or indirect sources of an electric field may be used, such as applying a fixed or variable voltage across the Josephson junction 102, applying a fixed or variable current across the Josephson junction 102, applying an external electric field using, e.g., parallel plates not in contact with the Josephson junction 102, etc. Any suitable voltage level may be applied that generates an electric field that does not damage the Josephson junction 102, such as anywhere from 0-1 volt. In one illustrative embodiment, a voltage of 0.45 volts is applied. It should be appreciated that the electric field is the physical cause of the effect. As such, a thicker (or thinner) junction may require more (or less) voltage to cause the same electric field. The wires 114 connecting the electric field generator 112 to the Josephson junction 102 may be any suitable wires 114 or other conductors, such as bonded wire, needle probes, circuit board traces, etc. It should be appreciated that with an indirectly applied electric field (such as by parallel plates), there may not be any wires 114 connecting the electric field generator 112 to the Josephson junction 102.

The resistance monitor 116 may be any suitable resistance monitor. In the illustrative embodiment, the resistance monitor 116 is embodied as a voltage sensor that detects the voltage across the Josephson junction 102 caused by the constant current of the electric field generator 112. Additionally or alternatively, the resistance monitor 116 may be embodied as any suitable resistance monitor, such as a 2-, 3-, or 4-wire resistance measurement configuration. In some embodiments, the electric field generator 116 may be disconnected or otherwise turned off when making a resistance measurement by the resistance monitor 116. The wires 118 connecting the resistance monitor 116 to the Josephson junction 102 may be any suitable wires 118 or other conductors, such as bonded wire, needle probes, circuit board traces, etc.

It should be appreciated that, in some embodiments, the resistance monitor 116 and the electric field generator 112 may be combined into a single component, such as a 2-, 3- or 4-wire resistance measurement device. For example, a combined resistance monitor and electric field generator may apply a current through wires 114 and then measure the voltage across the wires 114 and/or may apply a voltage across the wires 114 and then measure the current going through the wires 114.

The compute device 120 may be embodied as any type of compute device capable of performing the functions described herein. For example, the compute device 120 may be embodied as or otherwise be included in, without limitation, an embedded computing system, a System-on-a-Chip (SoC), a multiprocessor system, a processor-based system, a server computer, a desktop computer, a sled or blade of a rack, a disaggregated computing system such as a rack scale architecture system, a smartphone, a cellular phone, a wearable computer, a tablet computer, a notebook computer, a laptop computer, a handset, a messaging device, a camera device, a consumer electronic device, and/or any other computing device.

The illustrative compute device 120 includes a processor, a memory, communication circuitry, and data storage. In some embodiments, one or more of the illustrative components of the compute device 120 may be incorporated in, or otherwise form a portion of, another component. For example, the memory, or portions thereof, may be incorporated in the processor in some embodiments. The compute device 120 is configured to control and/or otherwise communicate with one or more of the heat source 110, the electric field generator 112, and the resistance monitor 116, as discussed in more detail below. The compute device 120 may control and/or communicate with the heat source 110, the electric field generator 112, and the resistance monitor using a wired or wireless communication protocol, such as a serial protocol, universal serial bus (USB), general purpose interface bus (GPIB), Ethernet, Bluetooth®, WiMAX, near field communication (NFC), etc.

It should be appreciated that, in some embodiments, an operator of the system 100 (i.e., a person) may control the heat source 110, the electric field generator 112, and/or the resistance monitor 116, and the compute device 120 may not be used or may not be included in the system 100.

Figure 2:
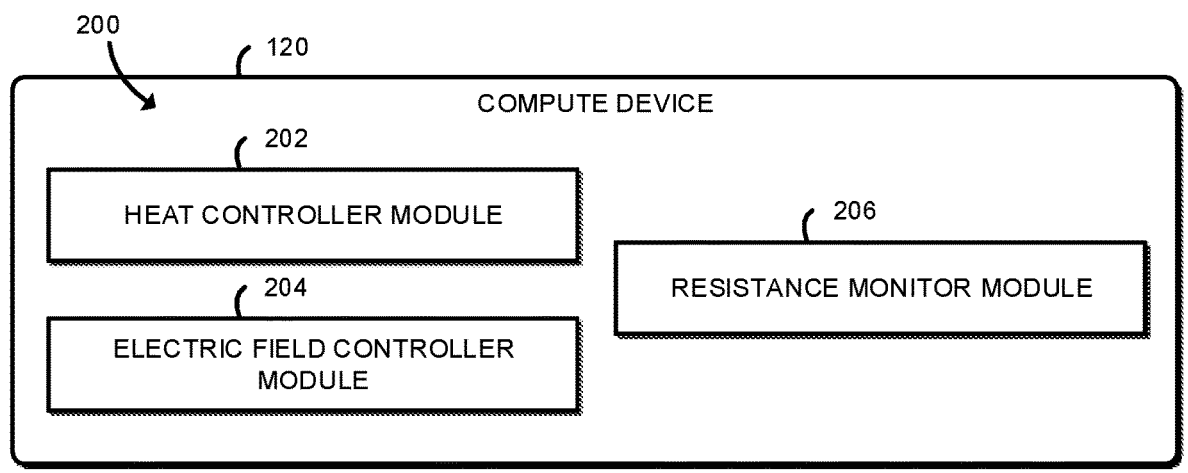
FIG. 2 is a block diagram of at least one embodiment of an environment that may be established by the compute device of FIG. 1.

Referring now to FIG. 2, in an illustrative embodiment, the compute device 120 establishes an environment 200 during operation. The illustrative environment 200 includes a heat controller module 202, an electric field controller module 204, and a resistance monitor module 206. The various components of the environment 200 may be embodied as hardware, software, firmware, or a combination thereof. For example, the various components of the environment 200 may form a portion of, or otherwise be established by, the processor, the memory, data storage, or other hardware components of the compute device 120. As such, in some embodiments, one or more of the components of the environment 200 may be embodied as circuitry or collection of electrical devices (e.g., heat controller circuitry 202, electric field controller circuitry 204, resistance monitor circuitry 206, etc.). It should be appreciated that, in such embodiments, one or more of the circuits (e.g., the heat controller circuitry 202, the electric field controller circuitry 204, the resistance monitor circuitry 206, etc.) may form a portion of one or more of the processor, the memory, the communication circuitry, the data storage, and/or other components of the compute device 120. For example, the heat controller circuitry 202 may be embodied as the processor and associated instructions stored on the data storage and/or the memory that may be executed by the processor. Additionally, in some embodiments, one or more of the illustrative components may form a portion of another component and/or one or more of the illustrative components may be independent of one another. Further, in some embodiments, one or more of the components of the environment 200 may be embodied as virtualized hardware components or emulated architecture, which may be established and maintained by the processor or other components of the compute device 120. It should be appreciated that some of the functionality of one or more of the components of the environment 200 may require a hardware implementation, in which case embodiments of components which implement such functionality will be embodied at least partially as hardware.

The heat controller module 202, which may be embodied as hardware (e.g., circuitry), firmware, software, virtualized hardware, emulated architecture, and/or a combination thereof as discussed above, is configured to control the heat source 110. The heat controller module 202 is configured to output a signal to the heat source 110, such as over a wired or wireless communication channel. The signal to the heat source 110 may indicate a desired heat output of the heat source 110, a desired temperature of the Josephson junction 102, and/or other parameter of the heat source 110. In some embodiments, the heat controller module 202 may also receive a signal from the heat source 110, such as a current temperature of the Josephson junction 102.

The electric field controller module 204, which may be embodied as hardware (e.g., circuitry), firmware, software, virtualized hardware, emulated architecture, and/or a combination thereof as discussed above, is configured to control the electric field generator 112. The electric field controller module 204 is configured to output a signal to the electric field generator 112, such as over a wired or wireless communication channel. The signal to the electric field generator 112 may indicate a desired current to apply to the Josephson junction 102, a desired voltage to apply across the Josephson junction 102, a desired electric field strength across the Josephson junction 102, a desired field strength across the metal oxide layer 106, and/or other parameter of the electric field generator 112. In some embodiments, the electric field controller module 204 may also receive a signal from electric field generator 112, such as a current voltage across the Josephson junction 102.

The resistance monitor module 206, which may be embodied as hardware (e.g., circuitry), firmware, software, virtualized hardware, emulated architecture, and/or a combination thereof as discussed above, is configured to interface with the resistance monitor 116. The resistance monitor module 204 is configured to receive a signal from the resistance monitor 116, such as over a wired or wireless communication channel. The signal from the resistance monitor 116 may indicate a current resistance of the Josephson junction. The indication of the current resistance may be the number of Ohms of resistance, a measured voltage, a measured current, etc. In some embodiments, the resistance monitor module 206 may send a signal to the resistance monitor 116, such as a request to measure resistance or a parameter of the resistance monitor 116. In some embodiments, the resistance monitor module 206 may include some or all of the resistance monitor 116.

It should be appreciated that the various modules and components of the compute device 120 may work together to implement the techniques disclosed herein. For example, in some embodiments, the heat controller module 202 and the electric field generator module 204 may apply heat and an electric field to the Josephson junction 102 until the resistance monitor module 206 measures an increase resistance of the Josephson junction 102 of, e.g., 1%. The heat controller module 202 and/or the electric field generator module 204 may remove the heat and/or electric field for a certain amount of time, then reapply them. In some embodiments, such a modulation of the heat and/or electric field may allow for a greater increase in resistance of the Josephson junction 102.

Figure 3:
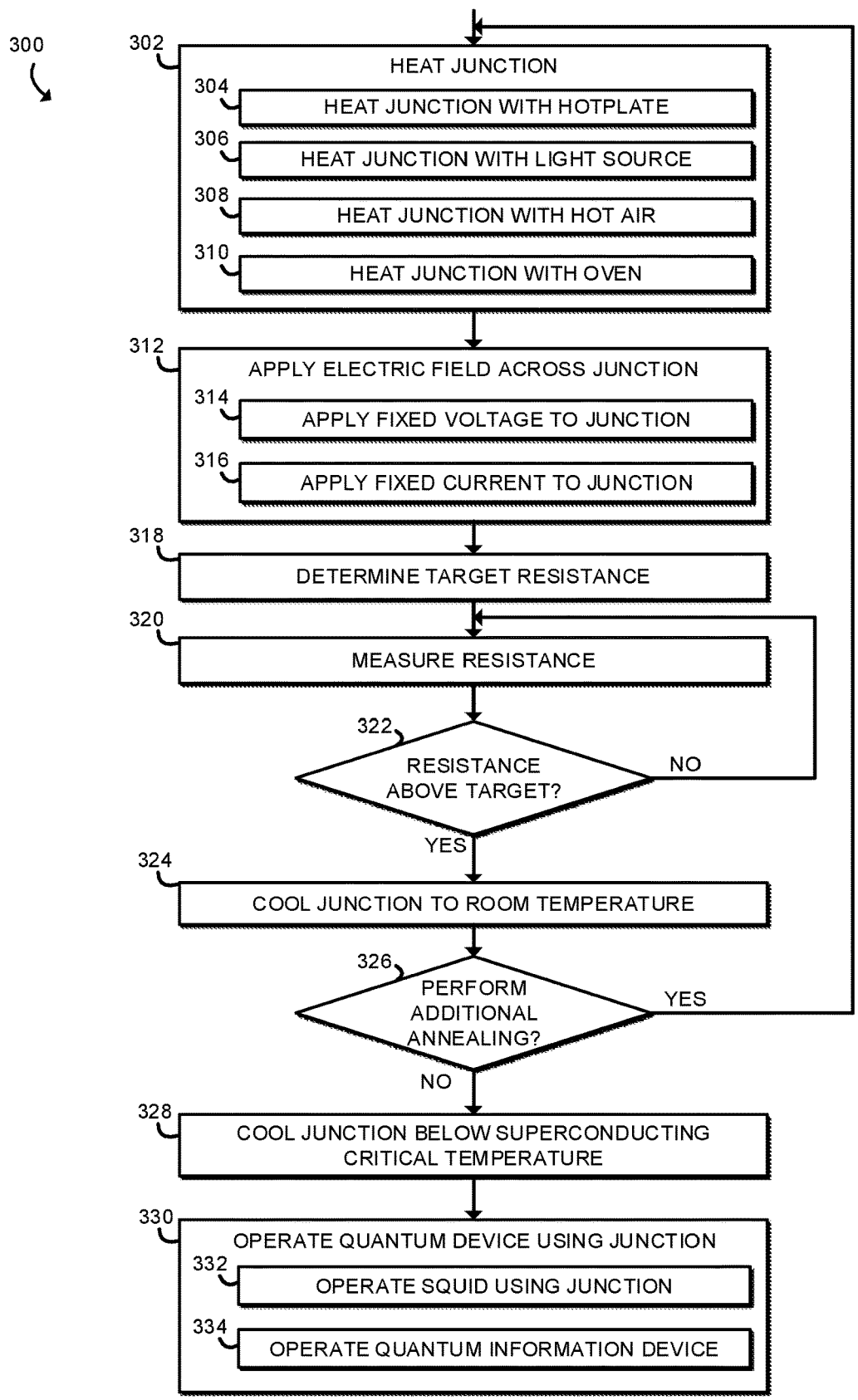
FIG. 3 is a simplified flow diagram of at least one embodiment of a method for tuning the resistance of a Josephson junction.

Referring now to FIG. 3, in use, an operator of the system 100 may perform a method 300 for tuning a resistance of a Josephson junction 102. In some embodiments, some or all of the features of the method 300 may be performed by the compute device 120. The method 300 begins in block 302, in which the heat source 110 heats the Josephson junction 102. In block 304, a hotplate may be used to heat the Josephson junction 102. In block 306, a light source may be used to heat the Josephson junction 102. In block 308, hot air may be used to heat the Josephson junction 102. In block 310, an oven may be used to heat the Josephson junction 102.

In block 312, an electric field generator 112 apples an electric field across the Josephson junction 102. The electric field generator 112 may apply a fixed voltage to the Josephson junction 102 in block 314 or may apply a fixed current to the Josephson junction 102 in block 316. For example, the electric field generator 112 may apply a fixed voltage of 0.45 volts or the electric field generator 112 may apply a fixed current of 60 microamps.

In block 318, a target resistance is determined. The target resistance may be a specific resistance level, a percentage increase in resistance, an increase in resistance above a baseline, or any other suitable target resistance. In some embodiments, there may be several target resistance levels, such as a first target resistance level for a first annealing and a second target resistance level for a second annealing.

In block 320, the resistance monitor 116 measures the resistance of the Josephson junction 102. The resistance monitor 116 may measure the resistance by measuring a voltage across the Josephson junction 102 caused by the constant current of the electric field generator 112. Additionally or alternatively, the resistance monitor 116 may perform any suitable resistance monitor, such as a 2-, 3-, or 4-wire resistance measurement configuration. In some embodiments, the electric field caused by the electric field generator 116 may be removed or otherwise changed when making a resistance measurement by the resistance monitor 116.

In block 322, if the measured resistance is not above the target resistance, the method 300 loops back to block 320 to measure the resistance again. It should be appreciated that, during the looping process, the application of heat and/or the application of the electric field may not necessarily be held constant. If the measured resistance is above the target resistance, the method 300 proceeds to block 324.

In block 324, the Josephson junction 102 is allowed to cool down to room temperature by removing the heat supplied by the heat source 110. Additionally or alternatively, in some embodiments, the Josephson junction 102 may be brought to a different temperature above or below room temperature. In the illustrative embodiment, while the Josephson junction 102 is cooling down to and at room temperature, the electric field generator 112 removes the electric field from the Josephson junction 102.

In block 326, if additional annealing is to be performed, the method 300 loops back to block 302 to heat up the Josephson junction 102. Multiple annealing steps with stages in between where the heat and/or electric field are removed may allow for a greater change in resistance compared to a single annealing step of equivalent time. If additional annealing is not to be performed, the method 300 proceeds to block 330.

In block 330, a quantum device is operated using the tuned Josephson junction 102. Any suitable quantum device may use the Josephson junction. For example, in block 332, a superconducting quantum interference device (SQUID) can be operated with use of the Josephson junction 102. In another example, in block 334, a quantum information device may be operated with use of the Josephson junction 102, such as by integrating the Josephson junction 102 into a qubit. The quantum information device may be a quantum circuit, a quantum computer, a quantum repeater, a part of a quantum cryptography system, etc. It should be appreciated that, in some embodiments, several Josephson junctions 102 may be tuned to have the same or nearly the same resistance, and those tuned Josephson junctions may be integrated together into the same quantum information device.

It should be appreciated that, in some embodiments, the resistance of a Josephson junction 102 may be tuned in a different manner than described in the method 300. For example, a parameter other than resistance at high temperature may be used as feedback, such as resistance at room temperature or resistance at a cryogenic temperature below a superconducting critical temperature of the metal layer of the Josephson junction 102. In some embodiments, a change in resistance may be induced by the application of heat and electric field without a change in resistance being used as feedback to control the heat and electric field. More generally, any application of an electric field at certain temperatures may be used to tune the resistance of the Josephson junction 102. For example, the Josephson junction 102 may be held at a certain temperature for a predetermined amount of time, and an electric field may be applied until the resistance reaches a desired amount. As another example, an electric field may be applied for a predetermined amount of time, and the temperature may be controlled to cause the resistance to reach a predetermined amount.

Figure 4:
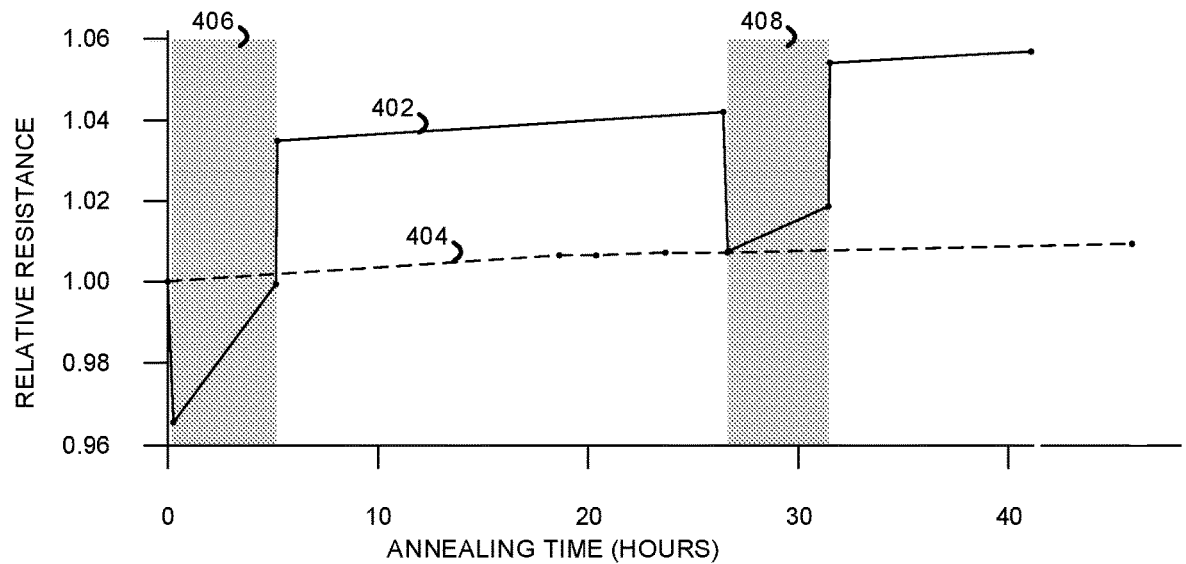
FIG. 4 is a graph showing a change in resistance of a Josephson junction over time with and without annealing.

Referring now to FIG. 4, a graph shows experimental data of a change in resistance in a Josephson junction is shown. A first graph line 402 represents a resistance of a first Josephson junction 102 that is being annealed by application of heat and an electric field, and a second graph line 404 represents a resistance of a second Josephson junction 102 that is not subject to the heat or electric field. It should be appreciated that Josephson junctions 102 may increase in resistance a small amount for some time after fabrication when held above cryogenic temperatures, which may be why the resistance represented by the second graph line 404 increases slightly.

To perform the annealing, the temperature of the first Josephson junction 102 is increased to 85° Celsius and a voltage of 0.45 volts is applied for a first time period 406. The increase in temperature causes a decrease in resistance that is reversed when the Josephson junction 102 is brought back to room temperature. The application of the voltage (which causes an electric field across the Josephson junctions) increases the resistance, and that increase remains when the temperature is returned to room temperature after the first time period 406. The annealing is repeated again at 85° Celsius with a voltage applied of 0.45 for a second time period 408. As shown in the graph, the second annealing further increases the resistance of the first Josephson junction.

Figure 5:
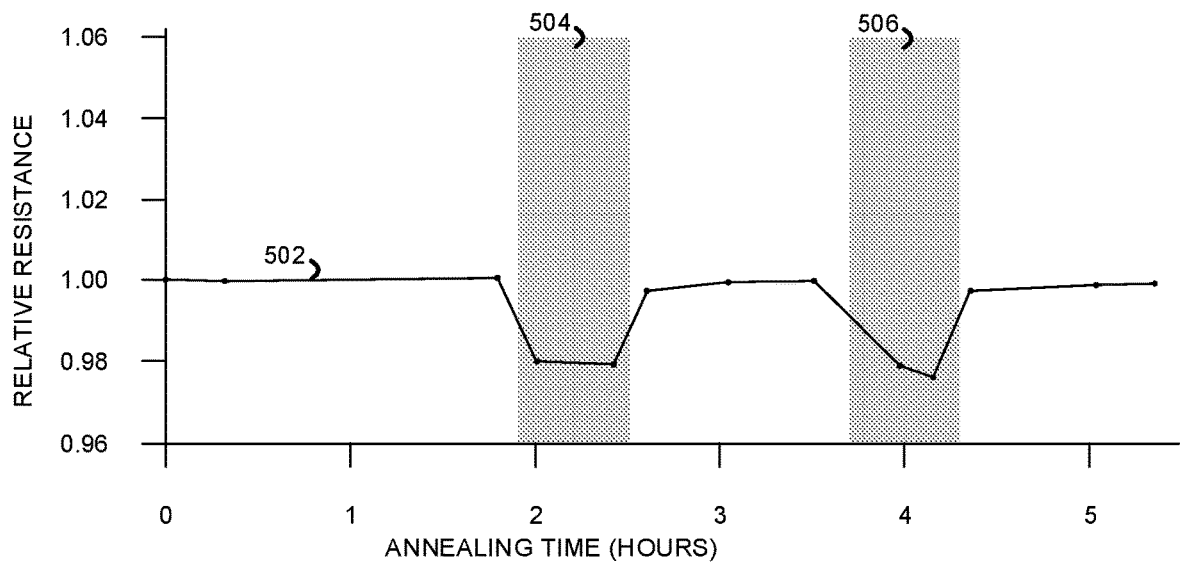
FIG. 5 is a graph showing a change in resistance of a Josephson junction over time without an applied electric field.

Referring now to FIG. 5, a graph shows experimental data of a change in resistance of a Josephson junction 102 without application of an electric field. A graph line 502 represents a resistance of the Josephson junction 102. The Josephson junction 102 is heated for a first time period 504 and a second time period 506, without any electric field being applied. The resistance of the Josephson junction 102 does not change from the starting resistance at room temperature, demonstrating that application of the electric field is necessary in increasing the resistance.

Figure 6:
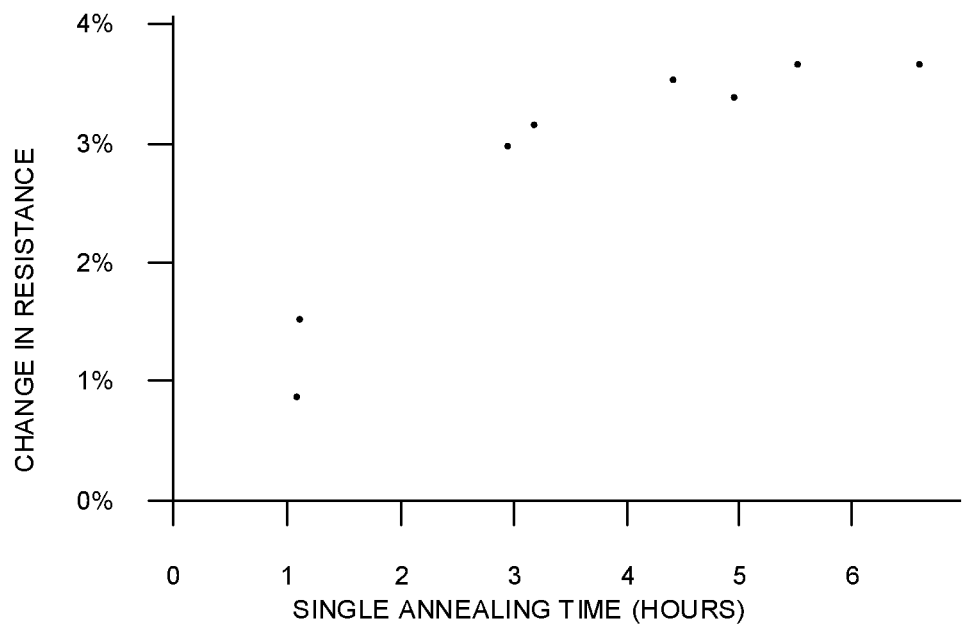
FIG. 6 is a graph showing a change in resistance of a Josephson junction over a single annealing.

Referring now to FIG. 6, a graph shows experimental data of a change in resistance of Josephson junctions 102 based on a duration of a single annealing step. Each data point represents a Josephson junction 102 annealed in a single step at 85° Celsius with an applied voltage of 0.45 volts. The graph shows that the resistance increases with a longer annealing time, with a possible saturation below 4%.

Figure 7:
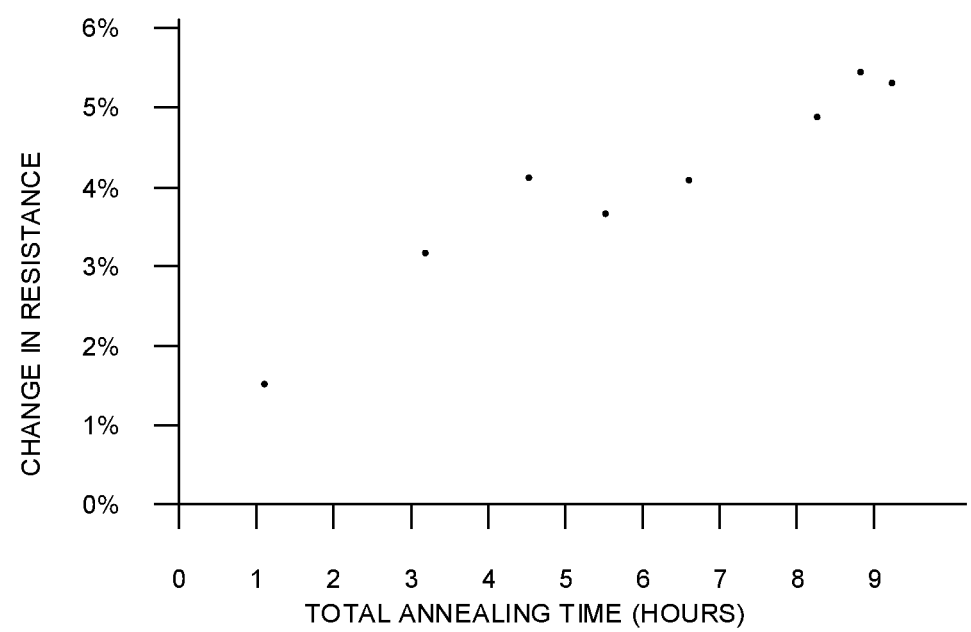
FIG. 7 is a graph showing a change in resistance of a Josephson junction over multiple annealings.

Referring now to FIG. 7, a graph shows experimental data of a change in resistance of Josephson junctions 102 based on a duration of two or more annealing steps. Each data point represents a Josephson junction 102 annealed in two or more step at 85° Celsius with an applied voltage of 0.45 volts. The graph shows that the resistance increases with a longer cumulative annealing time.

What is claimed is:

1. A method for tuning a resistance of a metal-metal oxide-metal junction, the method comprising:
   heating the metal-metal oxide-metal junction to a temperature of at least 60° Celsius;
   applying an electric field across the heated metal-metal oxide-metal junction,
   wherein applying the electric field across the heated metal-metal oxide-metal junction causes the resistance of the metal-metal oxide-metal junction to increase by at least 1%.

2. The method of claim 1, wherein heating the metal-metal oxide-metal junction to a temperature of at least 60° Celsius comprises heating the metal-metal oxide-metal junction to a temperature of at least 75° Celsius,
   wherein applying the electric field across the heated metal-metal oxide-metal junction comprises to apply a voltage of at least 0.3 volts across the heated metal-metal oxide-metal junction for a cumulative total of at least one hour to cause the resistance of the metal-metal oxide-metal junction to increase by at least 3%.

3. The method of claim 1, wherein the metal-metal oxide-metal junction is a superconductor-insulator-superconductor junction.

4. The method of claim 3, further comprising:
   cooling the superconductor-insulator-superconductor junction below a superconducting critical temperature of the superconductor-insulator-superconductor junction; and
   using the superconductor-insulator-superconductor junction in a quantum information circuit below the superconducting critical temperature and after causing the resistance to increase.

5. The method of claim 3, further comprising:
   cooling the superconductor-insulator-superconductor junction below a superconducting critical temperature of the superconductor-insulator-superconductor junction; and
   using the superconductor-insulator-superconductor junction in a superconducting quantum interference device (SQUID) below the superconducting critical temperature and after causing the resistance to increase.

6. The method of claim 1, wherein heating the metal-metal oxide-metal junction comprises at least one of (i) applying heat via direct conduction, (ii) applying heat via indirect convection, and (iii) applying heat via a coherent or incoherent radiation source.

7. The method of claim 1, wherein applying an electric field across the heated metal-metal oxide-metal junction comprises at least one of (i) applying electric field by passing a current through the heated metal-metal oxide-metal junction and (ii) applying an external electric field to the heated metal-metal oxide-metal junction.

8. The method of claim 1, further comprising:
   measuring a change in resistance of the metal-metal oxide-metal junction caused by application of the electric field to the heated metal-metal oxide-metal junction;
   controlling the applied electric field and the applied heat based on the measured change in resistance of the metal-metal oxide-metal junction.

9. The method of claim 8, wherein controlling the applied electric field and the applied heat based on the measured change in resistance of the metal-metal oxide-metal junction comprises:
   determining that the resistance of the metal-metal oxide-metal junction is above a predetermined threshold; and
   removing the electric field in response to a determination that the resistance of the metal-metal oxide-metal junction is above the predetermined threshold.

10. The method of claim 8, wherein controlling the applied electric field and the applied heat based on the measured change in resistance of the metal-metal oxide-metal junction comprises automatically controlling the applied electric field and the applied heat using a compute device.

11. The method of claim 10, further comprising modulating, by the compute device, the heat and electric field applied to the metal-metal oxide-metal junction.

12. A method for tuning a resistance of a tunnel junction, the method comprising:
   heating the tunnel junction to a temperature of at least 60° Celsius;
   applying an electric field across the heated tunnel junction;
   measuring a change in resistance of the tunnel junction caused by application of the electric field to the heated tunnel junction; and
   controlling at least one of the electric field applied across the heated tunnel junction or the temperature of the tunnel junction based on the measured change in resistance of the tunnel junction.

13. The method of claim 12, wherein heating the tunnel junction to a temperature of at least 60° Celsius comprises heating the tunnel junction to a temperature of at least 75° Celsius,
   wherein applying the electric field across the heated tunnel junction comprises to apply a voltage of at least 0.3 volts across the heated tunnel junction for a cumulative total of at least one hour to cause the resistance of the tunnel junction to increase by at least 3%.

14. The method of claim 12, wherein the tunnel junction is a superconductor-insulator-superconductor junction, the method further comprising:

cooling the superconductor-insulator-superconductor junction below a superconducting critical temperature of the superconductor-insulator-superconductor junction; and using the superconductor-insulator-superconductor junction in a quantum information circuit below the superconducting critical temperature and after causing the resistance to increase.

15. The method of claim 12, wherein controlling at least one of the electric field applied across the heated tunnel junction or the temperature of the tunnel junction based on the measured change in resistance of the tunnel junction comprises controlling at least one of the electric field applied across the heated tunnel junction or the temperature of the tunnel junction in order to match the resistance of the tunnel junction to a resistance of a second tunnel junction different from the first.

16. The method of claim 12, further comprising:
cooling the tunnel junction to room temperature after applying the electric field; and
repeating the steps of heating the tunnel junction to the temperature of at least 60° Celsius and applying the electric field across the heated tunnel junction.

17. The method of claim 12, wherein controlling the applied electric field and the applied heat based on the measured change in resistance of the tunnel junction comprises:
determining that the resistance of the tunnel junction is above a predetermined threshold; and
removing the electric field in response to a determination that the resistance of the tunnel junction is above the predetermined threshold.

* * * * *